Figure 1:
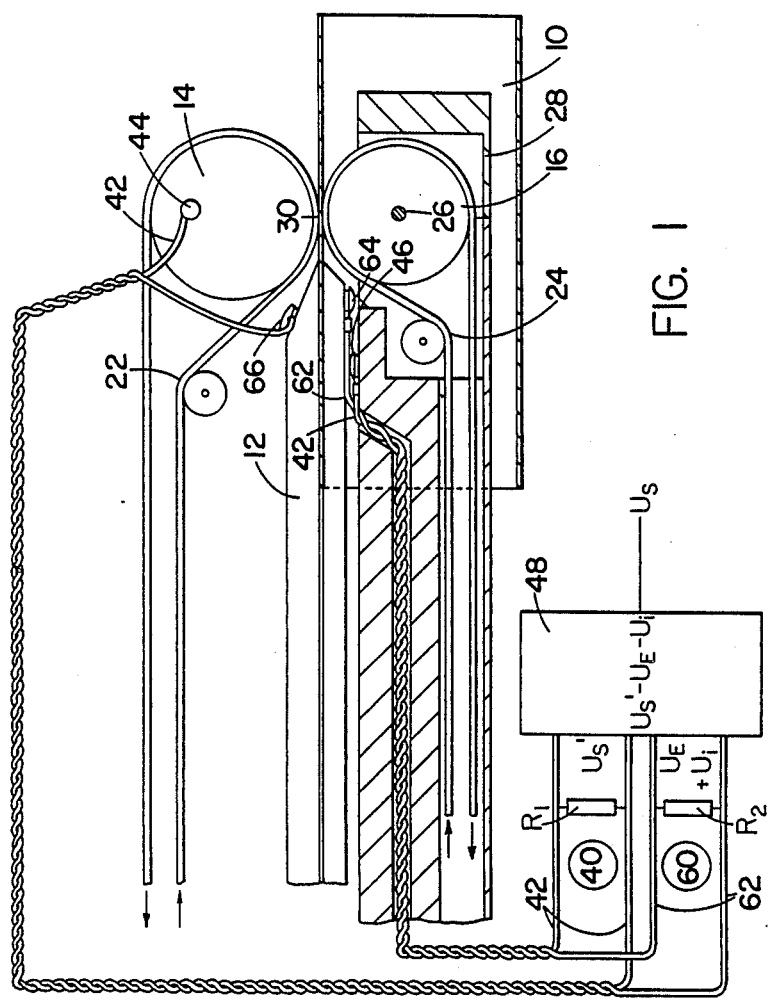

United States Patent [19]

Mueller

[11] Patent Number: 4,939,335
[45] Date of Patent: Jul. 3, 1990

[54] CIRCUIT FOR MEASURING THE VOLTAGE DROP BETWEEN THE WELDING ELECTRODES OF A RESISTANCE WELDING MACHINE

[75] Inventor: Willi Mueller, Berikon, Switzerland

[73] Assignee: Elpatronic AG, Zug, Switzerland

[21] Appl. No.: 357,315

[22] Filed: May 25, 1989

[30] Foreign Application Priority Data

Jun. 10, 1988 [CH] Switzerland ............... 02244/88

[51] Int. Cl.$^5$ ............................................. B23K 11/25
[52] U.S. Cl. .................................... 219/109; 219/64
[58] Field of Search ...................... 219/109, 110, 64

[56] References Cited

U.S. PATENT DOCUMENTS

| | | | |
|---|---|---|---|
| 4,403,132 | 9/1983 | Sugimoto | 219/109 |
| 4,449,028 | 5/1984 | Buxton | 219/109 |
| 4,714,816 | 12/1987 | Pazzaglia | 219/109 |

FOREIGN PATENT DOCUMENTS

2559671 6/1977 Fed. Rep. of Germany.
653786 1/1986 Switzerland.

*Primary Examiner*—Clifford C. Shaw
*Attorney, Agent, or Firm*—McCormick, Paulding & Huber

[57] ABSTRACT

What is described is a circuit for measuring the effective voltage drop at the welding position (30) between the welding electrodes (14,16) of a resistance seam welding machine. A first measuring loop (40) for measuring a first loop voltage is secured to the lower welding arm (28) close to the lower welding electrode (16) and is in communication with the upper welding electrode (14) through a sliding contact (44). The second measuring loop (60) is taken close to the welding electrodes (14,16) through the head portion of the Z-rail (12). The conductor turns (42,62) of both measuring loops, which lead to an evaluation circuit (48), are twisted together. Thus the stray effects picked up in the two measuring loops are the same. The difference between the two loop voltages formed in the evaluation circuit (48) is the effective voltage drop which is further processed in the usual manner to monitor the quality of the welding seam produced.

4 Claims, 2 Drawing Sheets

CIRCUIT FOR MEASURING THE VOLTAGE DROP BETWEEN THE WELDING ELECTRODES OF A RESISTANCE WELDING MACHINE

The invention relates to a circuit for measuring the voltage drop at the welding position between the welding electrodes of a resistance welding machine, having a first measuring loop for measuring a first loop voltage which comprises the voltage drop caused by the welding current between two tapping points at the welding electrodes and the voltage induced by the welding current in the first measuring loop, having a second measuring loop to measure a second loop voltage which comprises the voltage induced by the welding current in the second measuring loop and having an evaluation circuit to subtract the second loop voltage from the first loop voltage.

During the production of can bodies on resistance seam welding machines, the quality of the welding seam is influenced by a whole series of factors. Some of these influential factors are therefore measured individually by means of measuring circuits and an ejection device to reject the can bodies is actuated as a result of the value obtained if deviations occur from a given desired value of a specific parameter such as the temperature of the welding seam for example (CH-PS 653 786).

By means of a known measuring circuit of the kind mentioned at the beginning (U.S. Pat. No. 4,449,028), the time integral of the ohmic component of the welding voltage is determined over the half-cycles of the welding current in an alternating-current resistance seam welding machine, and is used as a measure of the energy consumed during the welding and to control an ejection device. The voltage which is measured as a first loop voltage in the known measuring circuit is a voltage which is designated by $U_S'$ in the vector diagram in the accompanying FIG. 3 and which is composed of $U_R$, $U_L$ (the ohmic plus inductive voltage drop caused by the welding current) and the induced stray voltages $U_{EK} + \Delta U_{EK} + U_i$. The voltage which is measured as a second loop voltage in the known measuring circuit is proportional to the voltage designated by $U_{EK}$ in the above-mentioned vector diagram. The subtraction of the two loop voltages is supposed to give the said ohmic voltage drop in the known measuring circuit although the inductive voltage drop $U_l$ is not included in the second loop voltage. This method of measuring is therefore relatively inaccurate. Furthermore, this method of measuring is inaccurate because the two measuring loops are far apart from one another and therefore different stray voltages are measured. An induced voltage component $\Delta U_{EK}$ as a function of the can bodies (of tin plate, that is to say of tinned sheet iron) present in the welding window will admittedly result in the first measuring loop but not in the second measuring loop. Furthermore, the area enclosed by the first measuring loop is considerably larger than that of the second measuring loop. Stray disturbing influences $U_i$ picked up therefore have a greater effect in the first measuring loop than in the second measuring loop. It is true that in the known measuring circuit provision is made for selecting the gains of amplifiers which are provided in the two measuring loops so that the second loop voltage, which is substantially inductive, has substantially the same magnitude as the reactive component of the first loop voltage but this selection can only be made for a very specific working point. The result of the measurement is then inaccurate for all other working points because the amount of iron in the welding window, which mainly influences the interspersions, varies continuously during the welding. Since the welding current can be assumed to be substantially constant during each welding operation, field configuration and field density in the region of the first measuring loop are therefore mainly altered by the varying iron content. The second measuring loop cannot detect this variation at least, however, because it is disposed far away from the welding window beside the upper bus bar and therefore is only influenced by the latter's field.

In a further known measuring circuit (U.S. Pat. No. 4 714 816), the voltage drop at the welding position is measured by means of a Hall element via the loop current in a loop which is formed by a flat wire electrode guided over the electrode rollers. The loop current includes an inductive component which is a consequence of the magnetic field which is produced in the loop by the welding current. In this loop, therefore, a voltage $U_S''$ is effectively measured, that is to say a voltage without the disturbing influences $U_i$. The field strength which originates from the welding current is measured in a second loop by a further Hall element. The variable portion $\Delta U_{EK}$ of the induced voltage, which depends on the number of can bodies in the welding window, is also not detected in the second measuring loop in this known measuring circuit so that this variable portion cannot be compensated for by subtraction of the two loop voltages. The signal formed by the subtraction therefore has fairly great fluctuations which lead to resolution problems during the evaluation of the quality of the weld in the last can bodies.

It is the object of the invention to improve a circuit of the kind mentioned at the beginning so that the voltage drop at the welding position can be measured considerably more accurately.

According to the invention, this problem is solved in that both measuring loops enclose substantially the same area and are twisted together —except in the region between the two tapping points.

In the circuit according to the invention, the two measuring loops are practically equally large and are situated at practically the same place, that is to say they enclose the same area. All stray effects in the two measuring loops therefore influence each of the measuring loops to the same extent. Then, when the two loop voltages are subtracted one from the other according to the invention, the result is the effective voltage drop $U_S$ at the welding position. The stray effects $U_E$ (that is to say $U_{EK} + \Delta U_{EK}$) and $U_i$ are therefore precisely compensated in the circuit according to the invention and this is so in every working point since their influence on the two measuring loops is always the same. In the circuit according to the invention, the first measuring loop extends as far as the two tapping points at the welding electrodes and measures, as the first loop voltage $U_S'$ the effective voltage drop $U_S$ plus the stray voltages $U_E$ and $U_i$, and the second measuring loop (compensating loop) is taken, as a closed winding, past the two welding electrodes, as close as possible thereto, and measures the interspersions $U_E$ and $U_i$ as the second loop voltage. As a result of the interdependent twisting, the two measuring loops are laid so that the area between their wires is practically equal to zero. Therefore, the voltage $U_S$ obtained is always precisely the difference between $U_S'$ and $U_E$ plus $U_i$.

A number of advantageous developments of the invention are described hereafter

In one development of the invention each measuring loop consists of a conductor turn, and the further processing of the measured voltage is the simplest. It would easily be possible, however, to produce each of the measuring loops from a plurality of conductor turns.

In another development of the invention in which the circuit according to the invention is used in a resistance roller seam welding machine for welding can bodies, in the region of the Z-rail, the head portion thereof forms the relevant part of the second measuring loop and therefore reaches to within the most immediate vicinity of the welding position.

In a still further development of the invention each measuring loop consists of a conductor turn, and sliding contact makes it possible to shift the tapping point in question as close as possible to the welding position.

One exemplary embodiment of the invention is described in more detail below with reference to the drawing.

Figure 3:
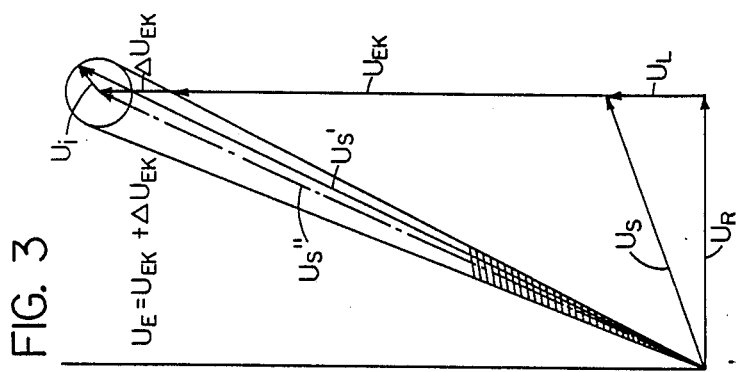
Figure 2:
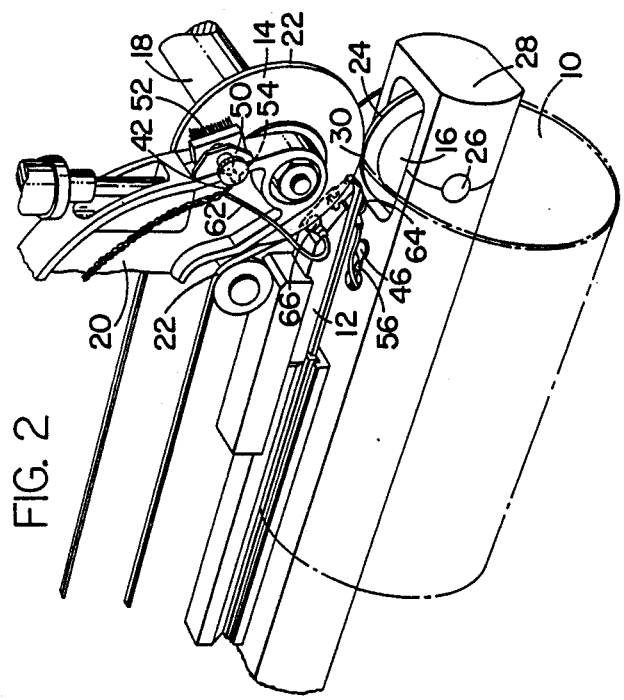

FIG. 1 shows part of a resistance seam welding machine with the circuit according to the invention, FIG. 2 shows, in an enlarged illustration, the region round the welding position in the resistance seam welding machine according to FIG. 1, and FIG. 3 shows a vector diagram serving for explanation, to which reference has already been made in the introduction to the specification.

In the following description of a circuit for measuring the voltage drop at the welding position between the welding electrodes of a resistance welding machine, it is true that reference is made to a resistance seam welding machine for the longitudinal seam welding of can bodies but the circuit described can likewise be used in other resistance welding machines such as spot welding machines, projection welding machines and the like.

In FIG. 1, only the parts of the resistance seam welding machine which are most essential for an understanding of the invention are illustrated. Can bodies 10 to be welded are conveyed from left to right in FIG. 1 on a so-called Z-rail 12 and introduced, by means of a conveyor chain not illustrated, between an upper electrode roller 14 and a lower electrode roller 16 for the longitudinal seam welding. Further details about this are found in DE-OS No. 25 59 671 originating from the Applicants themselves. As shown in FIG. 2, the upper electrode roller 14 is secured to one end of a shaft 18 which is mounted, at the other end, for rotation in a pendulum roller head not illustrated. At the end adjacent to the upper electrode roller 14, the shaft 18 is secured to the end of a pivotally mounted bracket 20 which guides the upper electrode roller 14 vertically and in the welding direction. According to FIGS. 1 and 2, a flat wire electrode 22, which has a rectangular cross-section, is guided over the upper electrode roller 14. A like flat wire electrode 24 is guided over the lower electrode roller 16. According to FIG. 1, the two flat wire electrodes 22,24 are led in and out at the left-hand side. Such flat wire electrodes serve the purpose of preventing the contamination of the electrode roller by combining with metal of the work to be welded (for example tin if can bodies of tin plate are to be welded). The lower electrode roller 16 consists of a rotor which is mounted for rotation on a stator which is secured to a shaft 26 which is gripped in a lower welding arm 28 which is split at the gripping point for this purpose. The welding current is supplied through the lower welding arm 28 and the transmission of current between the stator and the rotor of the lower electrode roller 16 is effected through liquid metal. Thus the welding position 30 is between the two electrode rollers 14,16 or more precisely between the two flat wire electrodes 22,24.

The construction of the resistance seam welding machine as described above is conventional. The circuit for measuring the effective voltage drop $U_S$ (see FIG. 3) will now be described.

The circuit comprises a first measuring loop 40 and a second measuring loop 60. The two measuring loops each consist of a conductor turn 42 or 62 respectively. The conductor turn 42 leads from an input of an electronic evaluation circuit 48 to two tapping points 44 and 46 which are provided on the upper electrode roller 12 and on the lower welding arm 28 respectively. Between the two tapping points 44,46, the first measuring loop is closed through the upper electrode roller 14, the welding position 30, the lower electrode roller 16 and its shaft 26. The conductor turn 62 leads from a further input of the electronic evaluation circuit 48 to two attachment points 64,66 on the head portion of the Z-rail 12, which are therefore in the immediate vicinity of the electrode rollers. The two conductor turns 42,62 are twisted together so that inductive stray effects from the outside are absolutely the same on the two measuring loops. At the inputs to the electronic evaluation circuit 48, the two measuring loops are each terminated by a resistor $R_1$ or $R_2$ respectively (each of 50 ohms for example). The first measuring loop 40 measures the voltage $$U_S' = U_S + U_{EK} + \Delta U_{EK} + U_i = U_S + U_E + U_i$$

The second measuring loop 60 measures the same voltage but without the component $U_S$. In the evaluation circuit 48, therefore, the effective voltage $U_S$ is determined as the difference between the two loop voltages which is then further processed for monitoring or control purposes as in the state of the art. The value of the effective voltage drop $U_S$ determined in this manner is very accurate because both measuring loops enclose substantially the same area and are twisted together—except in the region between the two tapping points 44,46.

According to the more detailed illustration in FIG. 2, in order to make the tapping point 44 on the upper electrode roller 14 cheaper, a brush holder 50 is secured to the bracket 20 and carries a brush 52 which is urged against the upper electrode roller 44 by a spring not illustrated. The tapping point 44 therefore consists of a sliding contact. The conductor turn 42 is connected up via a terminal 54. At the other end, the conductor turn 42 has a terminal 56 whereby it is connected to the lower arm 28 through a screw connection. The conductor turn 62 is connected to the head portion of the Z-rail 12 by means of corresponding terminals and screw connections in the manner illustrated in FIG. 2.

List of the voltage symbols used in the specification and in FIG. 3.

$U_R$ = Ohmic voltage drop as a result of the welding current $U_L$ = inductive voltage drop as a result of the welding current $U_S = U_R + U_L$ = *effective voltage drop*

$U_{EK}$ = voltage induced in the measuring loop $\Delta U_{EK}$=induced voltage component which depends on the number of can bodies in the welding window and which is induced in the measuring loop $U_i$=stray disturbing influences $U_E = U_{EK} + U_{EK}$ $U_S' = U_S + U_{EK} + \Delta U_{EK} + U_i = U_S + U_E + U_i$ $U_S = U_S + U_E$

I claim:

1. A circuit for measuring the voltage drop at the welding position between the welding electrodes of a resistance welding machine, comprising: a first measuring loop for measuring a first loop voltage which includes the voltage drop caused by the welding current between two tapping points at the welding electrodes and the voltage induced by the welding current in the first measuring loop, a second measuring loop for measuring a second loop voltage which includes the voltage induced by the welding current in the second measuring loop, and an evaluation circuit means to substract the second loop voltage from the first loop voltage, wherein the two measuring loops enclose substantially the same area and are twisted together—except in the region between the two tapping points.

2. A circuit according to claim 1, wherein each of the two measuring loops consists of a conductor turn.

3. A circuit according to claim 1 for a resistance seam welding machine having a Z-rail as a guide for can bodies supplied to the welding position wherein a portion of the second measuring loop between the two tapping points is formed by the head portion of the Z-rail.

4. A circuit according to claim 3, wherein the welding electrodes of the resistance welding machine include a lower welding electrode supported in a lower welding arm and an upper electrode supported above the lower electrode, and the tapping points in the first measuring loop are a terminal on the lower arm and a sliding contact on the upper welding electrode respectively.

* * * * *